United States Patent
Ha et al.

(10) Patent No.: US 9,639,421 B2
(45) Date of Patent: May 2, 2017

(54) OPERATING METHOD OF FLASH MEMORY SYSTEM

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Daejeon (KR); Su-Hwang Jeong, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/793,309

(22) Filed: Jul. 7, 2015

(65) Prior Publication Data

US 2016/0179616 A1  Jun. 23, 2016

(30) Foreign Application Priority Data

Dec. 19, 2014  (KR) .................. 10-2014-0184378

(51) Int. Cl.

| | | |
|---|---|---|
| G06F 11/10 | (2006.01) | |
| H03M 13/45 | (2006.01) | |
| H03M 13/29 | (2006.01) | |
| H03M 13/15 | (2006.01) | |
| G11C 29/52 | (2006.01) | |
| H03M 13/37 | (2006.01) | |
| H03M 13/00 | (2006.01) | |
| G11C 29/02 | (2006.01) | |

(Continued)

(52) U.S. Cl.
CPC ........ *G06F 11/1068* (2013.01); *G11C 29/021* (2013.01); *G11C 29/028* (2013.01); *G11C 29/42* (2013.01); *H03M 13/2909* (2013.01); *H03M 13/2927* (2013.01); *H03M 13/2963* (2013.01); *H03M 13/3746* (2013.01); *H03M 13/6577* (2013.01); *G11C 7/14* (2013.01); *G11C 11/5642* (2013.01); *G11C 16/26* (2013.01); *G11C 29/52* (2013.01); *H03M 13/152* (2013.01); *H03M 13/453* (2013.01)

(58) Field of Classification Search
None
See application file for complete search history.

(56) References Cited

U.S. PATENT DOCUMENTS

| | | | |
|---|---|---|---|
| 7,966,546 B2 | 6/2011 | Mokhlesi et al. | |
| 7,966,550 B2 | 6/2011 | Mokhlesi et al. | |

(Continued)

OTHER PUBLICATIONS

S. g. Cho, D. Kim, J. Choi and J. Ha, "Block-Wise Concatenated BCH Codes for NAND Flash Memories," in IEEE Transactions on Communications, vol. 62, No. 4, pp. 1164-1177, Apr. 2014.*

*Primary Examiner* — Justin R Knapp
(74) *Attorney, Agent, or Firm* — IP & T Group LLP

(57) ABSTRACT

An operation method of a flash memory system includes reading data stored in a memory device, wherein the data is encoded by units of message blocks each including a row constituent code and a column constituent code by using a block-wise concatenated Bose-Chadhuri-Hocquenghem (BC-BCH) method; performing a hard decision decoding on the read data; determining, when the hard decision decoding fails, a reference voltage for a message block having an error among the message blocks of the read data; and performing a soft decision decoding by using the determined reference voltage.

8 Claims, 8 Drawing Sheets

(51) Int. Cl.
*G11C 29/42* (2006.01)
*G11C 7/14* (2006.01)
*G11C 11/56* (2006.01)
*G11C 16/26* (2006.01)

(56) References Cited

U.S. PATENT DOCUMENTS

| | | |
|---|---|---|
| 8,074,151 B1 | 12/2011 | Burd et al. |
| 8,145,981 B2 | 3/2012 | Mokhlesi et al. |
| 8,335,977 B2 | 12/2012 | Weingarten et al. |
| 8,341,502 B2* | 12/2012 | Steiner ............... G06F 11/1012 714/755 |
| 8,627,188 B2 | 1/2014 | Weingarten et al. |
| 9,166,626 B2* | 10/2015 | Ha .................... H03M 13/2912 |
| 2012/0240007 A1* | 9/2012 | Barndt ............... H03M 13/1108 714/758 |
| 2013/0132793 A1* | 5/2013 | Ha .................... H03M 13/2912 714/755 |

\* cited by examiner

Parallel Concatenation

Serial Concatenation

Parallel Concatenation

OPERATING METHOD OF FLASH MEMORY SYSTEM

CROSS-REFERENCE TO RELATED APPLICATIONS

The present application claims priority of Korean Patent Application No. 10-2014-0184378, filed on Dec. 19, 2014, which is incorporated herein by reference in its entirety.

BACKGROUND

1. Field

Various embodiments of the present invention relate to a flash memory system and, more particularly, to an operating method of flash memory system for performing error correction with a concatenated Bose-Chadhuri-Hocquenghem (BCH) code.

2. Description of the Related Art

With the increase in speed of processors and main storage devices, such as RAM, a bottleneck has occurred in various electronic devices. The bottleneck is due to processors and main storage devices being limited by the operating speed of the auxiliary storage devices. Devices that store data using magnetic fields, such as hard disk drives (HDD), and optic disc drives (ODD), such as CDs and DVDs, have generally been used for auxiliary storage devices. The speed at which optical disc devices can operate is limited, and often slow relative to processor and main memory speeds. Devices that store data using magnetic fields generally operate at higher speeds than optical disc devices, but still cause bottlenecking, and are prone to damage from physical impacts. Accordingly, solid state drives (SSD) formed using semiconductor elements may be a solution to alleviate the bottlenecking problem. Solid state drives (SSD) have processing speeds higher than HDDs, and may input and output data at high speed without requiring time to search for data that needs to be randomly accessed. In addition, since SSDs have no moving parts, there are no mechanical delays or mechanical failures and the likelihood of damage from physical impact is significantly reduced. Further, SSDs are energy efficient, do not generate a lot of heat, and are quiet. Additionally, SSDs have a small form factor and relative to HDDs, making them ideal for portable electronic devices.

In SSDs, generally NOR flash memory or NAND flash memory is used. NAND flash memory is capable of being highly integrated and has serial connections, making it suitable for high capacity memory devices, and has high read/writing speeds. Therefore, NAND flash memory is used for most mass capacity SSD.

However, NAND flash memory is constantly undergoing miniaturization as is increasing being required to store multiple bits of information per memory cell. The increased storage density results in adverse effects including decreased reliability and product life.

FIGS. 1(A) to 1(D) are a diagram illustrating distributions of threshold voltages according to a number of bits stored in a flash memory cell.

Referring to FIGS. 1(A) to 1(D), a Single-Level Cell (SLC) flash memory (FIG. 1(A)) is a NAND element that stores 1-bit information, a Multi-Level Cell (MLC) flash memory (FIG. 1(B)) is a NAND element that stores 2-bit information, a Tri-Level Cell (TLC) flash memory (FIG. 1(C)) is a NAND element that stores 3-bit information, and a Quad-Level Cell (QLC) Flash Memory (FIG. 1(D)) is a NAND element that stores 4-bit information.

Referring to FIGS. 1(A) to 1(D), the likelihood of errors caused by inter-level interference increases during reading operations when there is an increase in the number of bits stored per cell, and the error occurrence drastically increases as reading/writing operations are repeated, resulting in decreased reliability of the product overall. Therefore, an error correction circuit that is both energy efficient and has high processing power is an essential element in designing stable NAND flash memories at reasonable prices.

To resolve this concern, error correction encoding is generally used. Error correction encoding requires extra bits of data storage to store information for error detection and correction. This requires chip area for extra memory cells to store the extra bits. However, to maximize the storage capacity of the storage medium, the area used to store the extra bits is miniaturized, and the amount extra bits required needs to be minimized as well.

In addition, due to the increase of data storage errors, advanced error correction encoding has been substituted for conventional BCH encoding and Reed-Solomon (RS) encoding. This advanced error correction encoding requires exponentially greater complexity and greater data storage.

A block-wise concatenated BCH (BC-BCH) code, as a substitution for conventional BCH code and the RS code, has excellent error correction performance with hard decision information, and the BC-BCH code decoder is less complex and more easily implemented than conventional BCH code decoders. However, soft decision information is indispensable for improving the decoding performance of BC-BCH code. To this end, information similar to soft decision information needs to be generated by raising the quantization level of the hard decision information. One option is to re-read the pages where errors occur by changing the threshold voltage of the page. However, it is not efficient to re-read pages by changing the threshold voltage because it is complex and the decoding is delayed.

Therefore, when threshold voltage is read limitedly, an optimal reference voltage for minimizing the error rate of the soft decision decoder may be sets That is, the error rate of the soft decision decoder may be lowered when the quantization level is raised through setting the optimal reference voltage.

That is, an optimal quantization method for minimizing the decoding error rate is required when the soft decision decoding (i.e., the turbo BC-BCH) is performed with additionally acquired soft decision information as the hard decision information if he BC-BCH code fails.

SUMMARY

Various embodiments of the present invention are directed to an operation method of a flash memory system for setting an optimal reference voltage to raise a quantization level.

In accordance with an embodiment of the present invention, an operation method of a flash memory system may include reading data stored in a memory device, wherein the data is encoded by units of message blocks each including a row constituent code and a column constituent code by using a block-wise concatenated Bose-Chadhuri-Hocquenghem (BC-BCH) method; performing a hard decision decoding on the read data; determining, when the hard decision decoding fails, a reference voltage for a message block having an error among the message blocks of the read data; and performing a soft decision decoding by using the determined reference voltage.

The soft decision decoding may include a turbo BC-BCH code decoding.

The turbo BC-BCH code decoding may be performed based on a chase decoding.

The reference voltage may be determined to maximize average numbers of error bits included in bits that are randomly selected among bits having relatively low reliability in the message block having the error, during the soft decision decoding.

The reference voltage may be determined according to Equation 1.

$$\hat{x} = \arg\max_{x} E[n_{fe}|dF],\qquad \text{Equation [1]}$$

Wherein $\hat{x}$ represents the reference voltage, $n_{fe}$ represents a number of error bits of the message block having an error with a value in the range $0 \le n_{fe} \le p$, $dF$ represents the message block having an error due to the failed hard decision decoding, $E[n_{fe}|dF]$ represents the average number of error bits included in the bits that are randomly selected among the bits having low reliability in the message block having an error when the hard decision decoding fails, and $p$ represents the bits that are randomly selected among the bits having low reliability in the message block having an error.

The operation method of claim 5, wherein the average number of error bits ($E[n_{fe}|dF]$) may be determined according to Equation 2.

$$\begin{aligned}
E[n_{fe}|dF] &= \Sigma_{n_{fe}} n_{fe} p(n_{fe}|dF) \\
&= \Sigma_{n_{fe}} n_{fe} \Sigma_{n_u} \Sigma_{n_e} \Sigma_{n_{ue}} \Sigma_{n_{bf}} p(n_u, n_e, n_{ue}, n_{fe}, n_{bf}|dF) \\
&= \Sigma_{n_{fe}} \frac{n_{fe}}{p(dF)} \Sigma_{n_u} \Sigma_{n_e} \Sigma_{n_{ue}} \Sigma_{n_{bf}} p(n_u, n_e, n_{ue}, n_{fe}, n_{bf}, dF)
\end{aligned}$$

$$p(n_u, n_e, n_{ue}, n_{fe}, n_{bf}, dF) = p(n_{fe}, dF | n_u, n_e, n_{ue}, n_{bf}) p(n_{ue}, n_e | n_u, n_{bf}) p(n_u | n_{bf}) p(n_{bf})$$

$$\begin{aligned}
p(n_{ue}, n_e | n_u, n_{bf}) &= p(n_{ue}, n_e | n_u, n_{bf} S_b + n - k - n_u) \\
&= p(n_{ue}, n_{re} | n_u, n_{bf} S_b + n - k - n_u)
\end{aligned}$$

$$\begin{aligned}
p(n_{ue}, n_{re} | n_u, n_{bf} S_b + n - k - n_u) &= p(n_{ue}, n_{re} | n_u, n_{tr}) \\
&= p(n_{ue} | n_u, n_{tr}) p(n_{ue} | n_u, n_{tr}) \\
&= p(n_{ue} | n_u) p(n_{re} | n_{tr})
\end{aligned}$$

$$p(n_{fe}, dF | n_u, n_e, n_{ue}, n_{bf}) = \frac{\binom{n_{ue}}{n_{fe}}\binom{n_{ue}-n_u}{p-n_{fe}}}{\binom{n_u}{p}}$$

[Equation 2]

wherein $n_u$ represents the number of bits having low reliability in the message block, $n_e$ represents a number of error bits of the message block, $n_{ue}$ represents a number of real error bits included in quantized bits of low reliability range in the message block, $n_{bf}$ represents a number of message blocks having an error among the message blocks, $p(n_{bf})$ represents a probability distribution for the message blocks that failed in the hard decision decoding among the message blocks, $p(n_u|n_{bf})$ represents a probability of bits having low reliability in the message block having the error, $S_b$ represents a number of bits of a single message block, n represents length of the message block to be decoded, k represents a number of bits of the message blocks, $n_{bf}S_b + n_c - k_c$, $n_u$ represents a number of bits having high reliability included in the message block having an error, $n_{re}$ represents a number of real error bits included in the quantized bits of the high reliability range in message block, $n_{tr}$ represents a number of the bits having high reliability included in the message block, $p(n_{re}|n_{tr})$ represents probability of error bits in the high reliability range, and $p(n_{ue}|n_u)$ represents a probability of error bits in the low reliability range.

The soft decision decoding may be performed by obtaining soft decision information using the determined reference voltage.

A decoding fail signal may be transfer to a host when the soft decision decoding fails.

The read data may be transfer to a host when the soft decision decoding is successful.

In accordance with an embodiment of the present invention, during a decoding operation with a block-wise concatenated BCH (BC-BCH) code and a turbo BC-BCH, when a hard decision decoding fails, location of an error and a number of error blocks may be obtained through a result of the hard decision decoding, then a reference voltage for maximizing the average number of correctable error bits at a soft decoding may be obtained on the basis of the location of an error and the number of error blocks, and then the soft, decoding may be performed through an optimal quantization with utilization of the basis of the reference voltage.

DETAILED DESCRIPTION

Figure 1A:
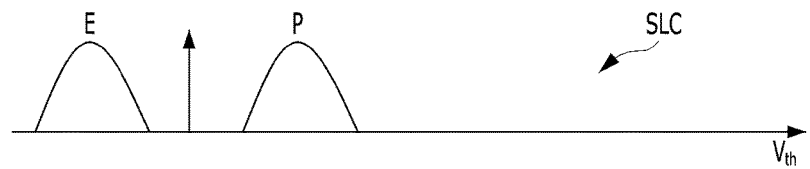
FIGS. 1(A) to 1(D) are a diagram illustrating distributions of threshold voltages according to a number of bits stored in a flash memory cell.
Figure 1B:
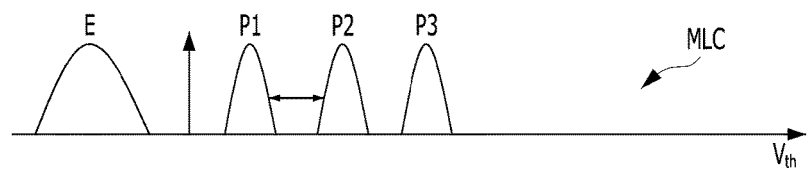
Figure 1C:
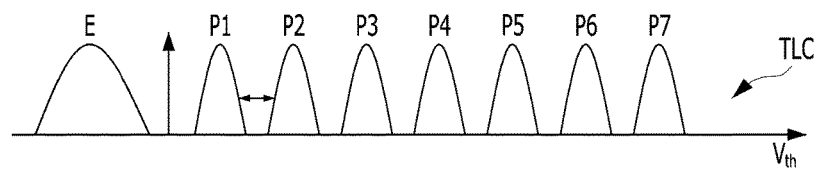
Figure 1D:
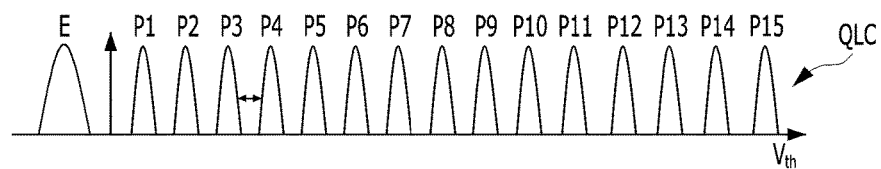

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale, and in some instances, proportions may have been exaggerated to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also to where a third layer exists between the first layer and the second layer or the substrate.

In general, a flash memory device has dies coupled to one another in parallel, and the die has a plurality of memory blocks each of which is a unit of the erase operation. Each memory block has a plurality of pages, which is the unit of the program/read operations. Therefore, the error correction operation is performed per single page. The size of a single page is 1 KB for a single level cell and 4 KB or 8 KB for a multi-level cell, generally.

The flash memory device as a storage device needs high reliability, and thus should operate with very low error rates when working with an error correction code. Also, flash memory devices require limited delay times, limiting the complexity of the encoder and decoder therein, for fast program and read speeds. Additionally, the flash memory device has a limiting ratio of parity bits to the rest of the stored data due to limited storage space for extra data, other than the user data, for storage efficiency. Therefore, as well as high coding rates, for example over 0.9, the error correction code for the flash memory device should have a no error floor, or at least an error floor that is solved with a short delay time and low complexity.

The block-wise concatenated BCH (BC-BCH) code that may be applied to an embodiment of the present invention may include a block as a unit. When the BC-BCH code does not include the block but a bit as a unit for better error correction performance than the conventional BCH code, the BC-BCH code may include a plurality of short length BCH constituent codes.

The short length BCH constituent code has very low error correction performance that may correct 1 or 2 bits due to the high coding rate required for the flash memory device. Therefore, in a flash memory device that is only capable of the hard decision, there may easily be the short length BCH constituent code of the BC-BCH code including the bit as a unit that fails in the error correction, and thus the BC-BCH code including the bit as a unit may have low error correction performance. In this case, the BC-BCH code including the bit as a unit may have improved error correction performance when using additional information. However, there may be relatively longer delay times and higher complexity of the decoding because the additional information is required for every decoding process.

The BC-BCH code that may be applied to an embodiment of the present invention fits the flash memory device. The BC-BCH code may include a small number of long length BCH constituent codes. The long length BCH constituent code has error correction performance for the high coding rate required for the flash memory device. For example, the BC-BCH code may include a long length BCH constituent code capable of correcting 10-bit and 14-bit errors. Therefore, in a flash memory device only capable of the hard decision, there may hardly be any long length BCH constituent code of the BC-BCH code that fails in the error correction, and thus the BC-BCH code including the long length BCH constituent code may have higher error correction performance than the BC-BCH code including the bit as a unit.

The BC-BCH code may fail in decoding by an error block because the BC-BCH code includes the block as a unit. For example, there may be the error floor due to the lower bound. The error floor may occur mainly because of a small numbers of the error blocks.

Hereinafter, an embodiment of the present invention will be described with reference to accompanying drawings.

Figure 2:
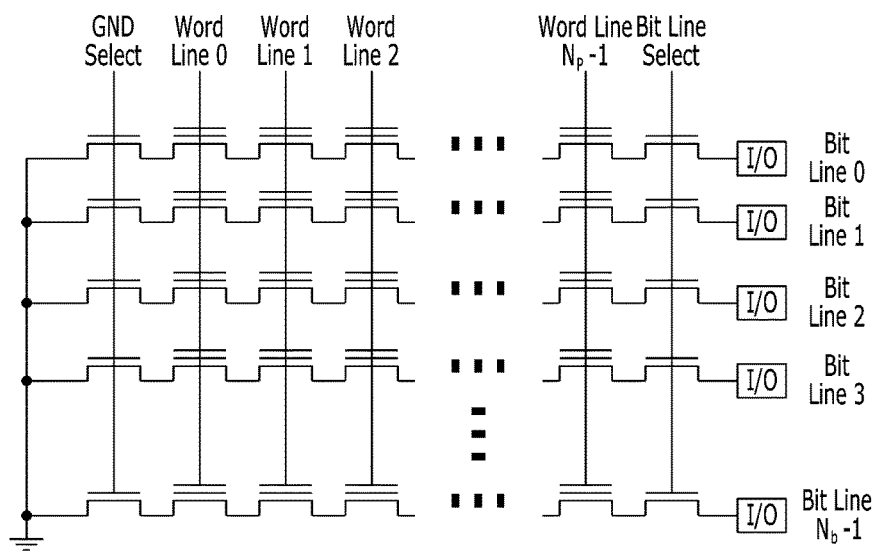
FIG. 2 is a diagram for describing a structure of a flash memory.

FIG. 2 is a diagram for describing a structure of a flash memory. Hereinafter, the structure of the flash memory device, unit of encoding/decoding of the error correction code, and an interference channel environment will be described with reference to FIG. 2.

Referring to FIG. 2, the error correction code of the flash memory may be programmed and read by a unit of a single page. A single block may include a plurality of word lines (Word Line 0 to Word Ling $N_p$-1) as well as bit lines (Bit Line 0 to Bit Line $N_b$-1). A single word line may be coupled to odd and even bit lines, and may have a plurality of pages according to bits of a single cell. For example, in a multi-level cell for storing 2-bit information, a single word line may be coupled to the odd and even bit lines and may have 2 pages for the least significant bit (LSB) and the most significant bit (MSB) per a single bit line and a total of 4 pages for the odd and even bit lines. As described above, the error correction code of the flash memory device may correct errors of the cells by a unit of the single page.

Figure 3A:
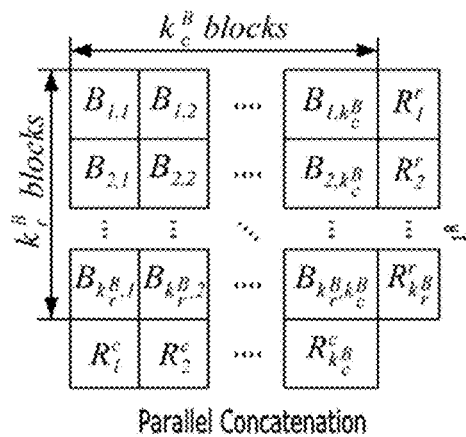
FIG. 3A is a diagram for describing a block-wise concatenated BCH code that is concatenated in parallel.
Figure 3B:
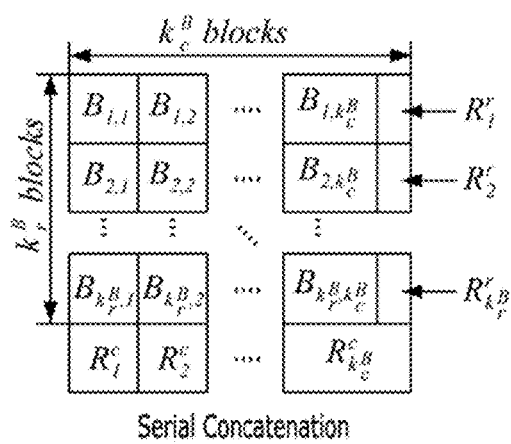
FIG. 3B is a diagram for describing a block-wise concatenated BCH code that is concatenated in series.

FIG. 3A is a diagram for describing a BC-BCH code that is concatenated in parallel (i.e., a parallel-concatenated BC-BCH code). FIG. 3B is a diagram for describing a BC-BCH code that is concatenated in series (i.e., a serial-concatenated BC-BCH code).

The block of the BC-BCH code is different from the memory block. The block of the BC-BCH code is a bundle of bits, which are sequentially arranged in line although the block of the BC-BCH code is illustrated as a square in FIGS. 3A and 3B. The BC-BCH code may include a message block and a parity block, or may include a message-parity block, in which the message block is combined with the parity block at the end thereof.

The BC-BCH code may include 2 kinds of the BCH constituent codes: a row BCH constituent code and a column BCH constituent code.

The row BCH constituent code may be the same as the column BCH constituent code in the parallel-concatenated BC-BCH code.

In the serial-concatenated BC-BCH code, the row BCH constituent code may serve as an outer code and the column BCH constituent code may serve as an inner code. A single row BCH constituent code may share a single block of BC-BCH code with a single column BCH constituent code. A single row BCH constituent code may share a single block with each of the column BCH constituent codes. A sing column BCH constituent code may share a single block with each of the row BCH constituent codes.

Both of the row BCH constituent code and the column BCH constituent code are BCH codes. The row BCH constituent code may correct $t_r$ bit-errors in $n_r$ bits having $k_r$ bits of a message to be protected and $m_r$ parity bits. The column BCH constituent code may correct $t_c$ bit-errors in $n_c$ bits having $k_c$ bits of a message to be protected and $m_c$ parity bits. Hereinafter, it is assumed that the amount of data to be protected by the BC-BCH code is k, where k is a natural number.

FIG. 3A is a diagram for describing a block-wise concatenated BCH code that is concatenated in parallel.

Referring to FIG. 3A, the data may correspond to a message matrix the size of which is $k_r^B \times k_c^B$ of message blocks $B_{i,j}$. A single row BCH constituent code may include $k_c^B$ message blocks and one or more parity blocks. A single column BCH constituent code may include $k_r^B$ message blocks and one or more parity blocks.

For example, the BC-BCH code may include a plurality of message blocks, each of which is $n_B$ bits, as follows. Referring to FIG. 3A, an $i^{th}$ row BCH constituent code may include the message blocks of the $i^{th}$ row and the parity blocks of the $i^{th}$ row, as shown in Equation 1.

$$C_i^r = [B_{i,1} \ldots B_{i,k_c^B} R_i^r] \quad \text{[Equation 1]}$$

Referring to FIG. 3A, $j^{th}$ column BCH constituent code may include the message blocks of the $j^{th}$ column and the parity blocks of the $j^{th}$ column, as shown in Equation 2.

$$C_j^c = [B_{i,j} \ldots B_{k_r^B,j} R_j^c] \quad \text{[Equation 2]}$$

The message length of the row BCH constituent code is shown in Equation 3.

$$k_r = k/k_r^B = n_B \times k_c^B \quad \text{[Equation 3]}$$

The code length of the row BCH constituent code is shown in Equation 4.

$$n_r = k_r + m_r \quad \text{[Equation 4]}$$

The message length of the column BCH constituent code is shown in Equation 5.

$$k_c = k/k_c^B = n_B \times k_r^B \quad \text{[Equation 5]}$$

The code length of the column BCH constituent code is shown in Equation 6.

$$n_c = k_c + m_c \quad \text{[Equation 6]}$$

The code rate of the BC-BCH code is shown in Equation 7.

$$R = \frac{k}{(k + m_r k_r^B + m_c k_c^B)} \quad \text{[Equation 7]}$$

In the above case, a single message block may include $n_B = k/(k_r^B \times k_c^B)$ bits, which is the same as the other message blocks.

When interleaving in order for each row BCH constituent code to have a different size of message block from the other row BCH constituent code, while all the message blocks in a same row of BCH constituent code have the same size, row $i^{th}$ BCH constituent code may include the message blocks of the $i^{th}$ row and the parity blocks of the $i^{th}$ row, as shown as Equation 1, and $j^{th}$ column BCH constituent code may include the message blocks of the $j^{th}$ column and the parity blocks of the $j^{th}$ column, as shown as Equation 8.

$$C_j^c = [B_{1,f(j)} B_{2,f(j+1)} \ldots B_{k_r^B, f(j+k_r^B-1)} R_j^c],$$
$$\text{where } f(x) = \{(x-1) \mod k_c^B\} + 1 \quad \text{[Equation 8]}$$

FIG. 3B is a diagram for describing a block-wise concatenated BCH code that is concatenated in series.

Referring to FIG. 3B, the data may be assigned to the message block, and the last block of each row BCH constituent code may be the parity block for the row BCH constituent code or the message-parity block for the row BCH constituent code. Except for the parity block for the column BCH constituent code, the message matrix may have the size of $k_r^B \times k_c^B$ of message blocks $B_{i,j}$ and include the message block, the message-parity block for the row BCH constituent code, and an extra parity block in each row. A single row BCH constituent code may include $k_c^B$-1 number of message blocks and a single message-parity block. A single column BCH constituent code may include $k_r^B$ number of message blocks or the message-parity blocks and a single parity block. The serial-concatenated BC-BCH code may be designed so that the row BCH constituent code may correct more errors than the column BCH constituent code may correct ($t_r \leq t_c$).

For example, the serial-concatenated BC-BCH code may be designed so that each of the message blocks and the message-parity blocks may include $n_B$ bits as follows. Referring to FIG. 3B, $i^{th}$ row BCH constituent code may include the message blocks and the parity blocks of $i^{th}$ row as shown above in Equation 1.

Referring to FIG. 3B, $i^{th}$ column BCH constituent code may include the message blocks and the parity blocks of $j^{th}$ column as shown as equation 9 when $1 \leq j \leq k_c^B$.

$$C_j^c = [B_{i,j} \ldots B_{k_r^B,j} R_j^c] \quad \text{[Equation 9]}$$

The $j^{th}$ column BCH constituent code may include the message blocks and the parity blocks of $j^{th}$ column as shown as Equation 10 when $j = k_c^B$.

$$C_j^c = [\{B_{i,j}, R_i^c\} \ldots \{B_{k_r^B,j}, R_{k_r^B}^c\} R_j^c] \quad \text{[Equation 10]}$$

The length of the message of the re BCH constituent code may be represented as shown in Equation 11.

$$k_r = k/k_r^B \quad \text{[Equation 11]}$$

The length of the code of the row BCH constituent code may be represented as shown in Equation 12.

$$n_r = k_r + m_r = n_B \times k_c^B \quad \text{[Equation 12]}$$

The length of the message of the column BCH constituent code may be represented as shown in Equation 13.

$$k_c = n_B \times k_r^B \quad \text{[Equation 13]}$$

The length of the code of the column BCH constituent code may be represented as shown in Equation 6.

The code rate of the serial-concatenated BC-BCH code may be represented as above-described Equation 7.

In the serial-concatenated BC-BCH code, each of the message blocks and the message-parity blocks has the same number of bits, which is represented as $n_B = (k+m_r \times k_r^B)/(k_r^B \times k_c^B) = n_r/k_c^B$.

When interleaving, in order for each row BCH constituent code to have different sizes of message blocks from the other row BCH constituent code, while all the message blocks in a single row BCH constituent code have the same size, the row BCH constituent code and the column BCH constituent code may be represented similarly to the above-described Equations 1 and 8, respectively.

For convenience, the parallel-concatenated BC-BCH code will be described hereinafter. However, the description will be applied to the serial-concatenated BC-BCH code.

Figure 4:
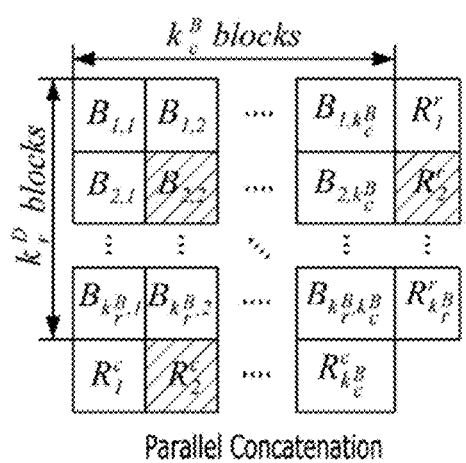
FIG. 4 is a diagram for describing a block-wise concatenated BCH code that is concatenated in parallel in accordance with an embodiment of the present invention.

FIG. 4 is a diagram of a parallel-concatenated BC-BCH code in accordance with an embodiment of the present invention.

The decoding according to the BC-BCH code is an iterative decoding by which the row BCH constituent code and the column BCH constituent code are alternately decoded. When such iterative decoding fails, new information from an iterative hard decision that is very similar to the result from the soft decision may be transferred to the decoder and the decoder may perform the chase decoding. The new information transferred to the decoder may be limited to decoding-failed parity blocks like the failed message block.

FIG. 4 shows the failed BC-BCH code due to a decoding fail of a pair of BCH constituent codes. FIG. 4 exemplarily shows a decoding fail of each of $2^{nd}$ row BCH constituent code and $2^{nd}$ column BCH constituent code after iterations of the hard decision decoding.

The decoding error rate of the BC-BCH code is very low because the error correction capability of the BCH constituent code of the BC-BCH code is greater than the product code. Therefore, when the BCH constituent code of the BC-BCH code succeeds in decoding, all of the errors are corrected. When the decoding fails due to an error message block, since the BC-BCH code includes blocks, the decoding may be retried by reading again the message block having the error. However, as described above, re-reading the page that has been read requires higher complexity and decoding delay time. Therefore, it is important to improve the performance through the result of the hard decision decoding without re-reading the message block.

Figure 5:
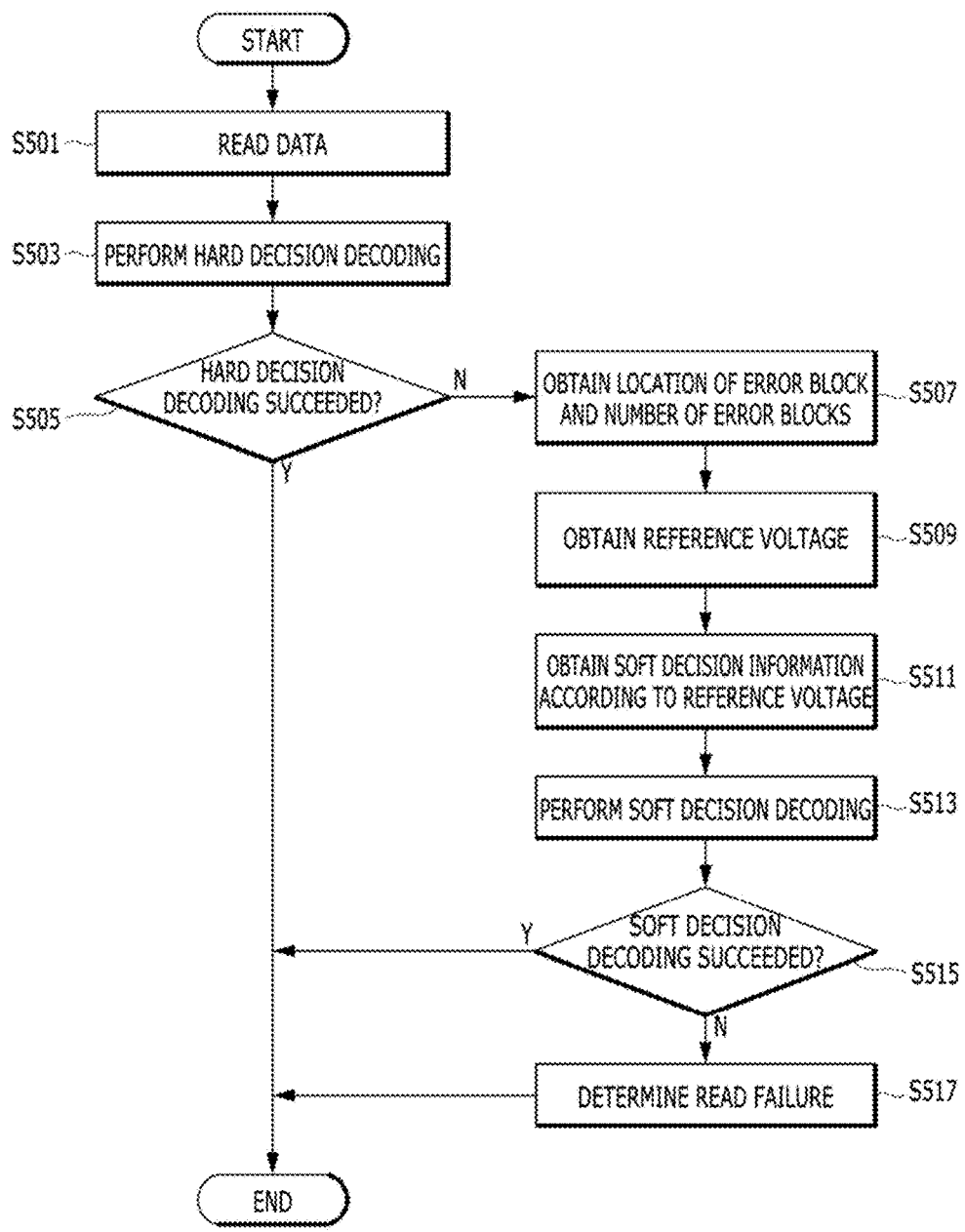
FIG. 5 is a flow chart for describing an operation method of a memory system using a block-wise concatenated BCH code in accordance with an embodiment of the present invention.

FIG. 5 is a flow chart for describing an operation method of a memory system using the BC-BCH code in accordance with an embodiment of the present invention.

Before describing the operation method with reference to FIG. 5, a prior condition will be described with reference to FIG. 6. The prior condition is the single level cell (SLC) that stores a single bit. However, the prior condition may expand to the multi-level cell (MLC), the triple-level cell (TLC) and so forth.

Also, the prior condition assumes that the soft information is 2-bit quantized information through 3 read times of a flash memory. That is, the prior condition assumes that each of information stored as "0" and "1" is read with the 2-level reliability information. Referring to FIG. 6, there may 4 channel outputs when $1^{st}$ to $3^{rd}$ reference voltages are set to 0, $\chi$ and $-\chi$, respectively. $\chi$ may be the optimal reference voltage. When read by the reference voltages, bits located between $\chi$ and $-\chi$ may be determined to have low reliability and thus may be included in $n_u$ numbers of bits while bits located outside of $\chi$ and $-\chi$ may be determined to have high reliability and thus may be included in $n_r$ numbers of bits.

Especially for the soft decision decoding, or for the decoding through the turbo BC-BCH code, among the constituent codes (the row BCH constituent code and the column BCH constituent code) included in the BC-BCH code, "p" number of bits having the lowest reliability may be selected and may be flipped with the $2^p$ numbers of cases according to the chase decoding. Each of the $n_u$ numbers of bits having low reliability may have small absolute values of the likelihood ratio between being "0" and "1".

When the $n_u$ numbers of bits having the low reliability are greater than "p", "p" numbers of bits may be randomly selected among the $n_u$ numbers of bits having the low reliability. In general, when the $n_u$ numbers of bits having the low reliability are smaller than "p", there may be high probability that $n_r$ numbers of bits having the high reliability are included in the selected "p" numbers of bits. That is, the performance of the decoder may not be improved through the chase decoding because there is low probability that the $n_r$ numbers of bits having the high reliability have errors. That is, the performance of the decoder may be improved when the quantization range $\chi$ is sufficiently wide and thus the $n_u$ numbers of bits having the low reliability are greater than "p". Therefore, it can be assumed that the $n_u$ numbers of bits having the low reliability are greater than "p" ($n_u$>p).

Referring to FIG. 5 at step S501 a controller may read data from the memory block of the flash memory device by using a read voltage.

At step S503, the controller may perform the hard decision decoding on the data read from the memory block for the error detection and the error correction. At step S505, the controller may determine whether the hard decision decoding is successful.

When the hard decision decoding is determined to be successful as a result of step S505, the controller may transfer the read data to a host.

However, the hard decision decoding may not correct the error.

When the hard decision decoding is determined to fail as the result of step S505, the controller may obtain the location and the number of error blocks from the failed result of the hard decision decoding at step S507. That is, the controller may obtain the location and the number of the error blocks from the failed result of each of row and column BCH constituent codes included in the BC-BCH code.

At step S509, the controller may determine the optimal reference voltage using the location and number of the error blocks obtained at step S507 for maximizing the average number of error bits during the decoding with the turbo BC-BCH code or the chase code.

That is, when iteration ends during the hard decision decoding of the BC-BCH code, the controller may determine whether the hard decision decoding is successful, and may perform the soft decision decoding or the chase decoding when the hard decision decoding is determined to have failed. To improve performance of the chase decoding, the "p" numbers of bits having the lowest reliability, which are selected among the $n_u$ numbers of bits having low reliability, should include a lot of error bits when the decoding is performed with the BCH constituent code. In this situation, there may be a lot of error bits to be flipped and the success probability of the decoding with the BCH constituent code may be elevated during the chase decoding, and the performance of the decoding through the turbo BC-BCH code may be improved.

That is, the optimal reference voltage should be determined so that the "p" numbers of bits having the lowest reliability that are selected among the $n_u$ numbers of bits having low reliability include a lot of error bits. Therefore, the optimal reference voltage should be determined so that $n_{fe}$ number of the error bits included in the "p" number of bits having the lowest reliability that are selected among the $n_u$ numbers of bits having low reliability may be maximized on average while the "p" number of bits having the lowest reliability that are selected among the $n_u$ numbers of bits having low reliability may be flipped, which is represented in Equation 14.

$$\hat{x} = \arg\max_x E[n_{fe}|dF] \qquad \text{[Equation 14]}$$

$E[n_{fe}\uparrow dF]$ represents the average number of error bits included in the bits that are randomly selected among the bits having low reliability in the message block having the errors when the hard decision decoding fails. 'dF' the failed case of the hard decision decoding. $\hat{x}$ represents the reference voltage to be determined. When $\hat{x}$ is determined, the reference voltages may be $\{-\hat{x}, 0, \hat{x}\}$ for 3 times of the soft reads.

The number of error bits included in the BCH constituent code may be represented as $n_e$, the number of real error bits included in the quantized bits of the low reliability range in the BCH constituent code may be represented as $n_{ue}$, the number of the decoding-failed message blocks included in the BCH constituent code during the iterative hard decision decoding may be represented as $n_{bf}$, and $E[n_{fe}|dF]$ may be represented as shown in Equation 15.

$$E[n_{fe} \mid dF] = \sum_{n_{fe}} n_{fe} p(n_{fe} \mid dF)$$
$$= \sum_{n_{fe}} n_{fe} \sum_{n_u} \sum_{n_e} \sum_{n_{ue}} \sum_{n_{bf}} p(n_u, n_e, n_{ue}, n_{fe}, n_{bf} \mid dF)$$
$$= \sum_{n_{fe}} \frac{n_{fe}}{p(dF)} \sum_{n_u} \sum_{n_e} \sum_{n_{ue}} \sum_{n_{bf}} p(n_u, n_e, n_{ue}, n_{fe}, n_{bf}, dF)$$

[Equation 15]

It is difficult to directly draw the probability $p(n_u, n_e, n_{ue}, n_{fe}, n_{bf}, n_{bf}, dF)$, and thus the probability $p(n_u, n_e, n_{ue}, n_{fe}, n_{bf}, dF)$ may be represented as Equation 16 when using the characteristics of the conditional probability.

$p(n_u, n_e, n_{ue}, n_{fe}, n_{bf}, dF) = p(n_{fe}, dF|n_u, n_e, n_{ue}, n_{bf})$
$p(n_{ue}, n_e|n_u, n_{bf})p(n_u|n_{bf})p(n_{bf})$ [Equation 16]

Each term of Equation 16 will be described hereinafter. $E[n_{fe}|dF]$ may be represented as the function of the reference voltage due to each term and $\hat{x}$ may be determined.

When the probability of $n_u$ number of bits having low reliability is defined as $p_u$ and the number of bits included in a single block is defined as $S_b$, $p(n_u|n_{bf})$ may follow the binominal distribution of $B(n_{bf}S_b+n_c-k_c, n_u, p_u)$. "$n_c-k_c$" may have the same size as the parity block included in the BCH constituent code and may be replaced with above-described "$m_c$". Also, the binominal distribution may be defined as $B(n_{bf}S_b+n_c-k_c, n_u, p_u)$. Referring to FIG. 6, the probability $p_u$ of the $n_u$ numbers of bits having low reliability may be determined through the characteristics of the Gaussian distribution.

The length "n" of the BCH constituent code for the decoding, and "k" number of message bits of the BCH constituent code may not be the probability variables. Also, when the number of real error bits included in the quantized bits of the high reliability range in the BCH constituent code is defined as $n_{re}$, it may be true that $n_{re}+n_{ue}=n_e$. Then, $p(n_u, n_e|n_{ue}, n_{bf})$ may be represented as Equation 17.

$p(n_{ue}, n_e|n_u, n_{bf}) = p(n_{ue}, n_e|n_u, n_{bf}S_b+n-k-n_u)$ $= p(n_{ue}, n_{re}|n_u, n_{bf}S_b+n-k-n_u)$ [Equation 17]

When the $n_u$ numbers of bits having low reliability and $n_{bf}S_b+n-k-n_u$ number of bits having high reliability in the BCH constituent code for the decoding are given, there may be $n_{ue}$ number of bits only in the $n_u$ number of bits having low reliability and there may be $n_{re}$ number of bits only in the $n_{bf}S_b+n-k-n_u$ number of bits having high reliability. Therefore, when the $n_u$ number of bits having low reliability and $n_{bf}S_b+n-k-n_u$ number of bits having high reliability in the BCH constituent code for the decoding are given, the $n_{ue}$ number of bits and the $n_{re}$ number of bits may be the conditional independence. The reason why the number of bits having high reliability is represented as $n_{bf}S_b+n-k-n_u$ is because the part of the BCH constituent code to be really soft-decision decoded is limited to the sum $(n_{bf}S_b+n_C-k_C)$ of lengths of the message blocks and the parity blocks that failed in the hard decision decoding, and all of the bits are determined to have low or high reliability.

Therefore, when the $n_{bf}S_b+n-k-n_u$ number of bits having high reliability among the bits of the BCH constituent code is defined as $n_{tr}$, Equation 17 may be represented as Equation 18.

$p(n_{ue}, n_{re}|n_u, n_{bf}S_b+n-k-n_u) = p(n_{ue}, n_{re}|n_u, n_{tr}) =$
$p(n_{ue}|n_u, n_{tr})p(n_u, n_{tr}) = p(n_{ue}|n_u)p(n_{re}|n_{tr})$ [Equation 18]

When the probability of error in the high reliability range is defined as $p_{re}$ and the probability of error in the low reliability range is defined as $p_{ue}$, $p(n_{re}|n_{tr})$ may be represented as the binominal distribution of $B(n_{tr}, n_{re}, p_{re})$ and $p(n_{ue}|n_u)$ may be represented as the binominal distribution of $B(n_u, n_{ue}, p_{ue})$. The probability $p_{re}$ and the probability $p_{ue}$ may be obtained from the Gaussian distribution shown in FIG. 6.

The probability $p(n_{fe}, dF|n_u, n_e, n_{ue}, n_{bf})$ may be represented as Equation 19 because $n_u \geq p$.

$$p(n_{fe}, dF \mid n_u, n_e, n_{ue}, n_{bf}) = \frac{\binom{n_{ue}}{n_{fe}}\binom{n_{ue}-n_u}{p-n_{fe}}}{\binom{n_u}{p}}$$

[Equation 19]

$n_{fe}$ may have a value in the range $0 \leq n_{fe} \leq p$, and the number of remaining error bits should be greater than the error correction capability of the BCH constituent code for the decoding. This is basically because the failure probability of the hard decision decoding should be determined. $p(n_{bf})$ is the probability distribution for the decoding-failed blocks in the BCH constituent code. To obtain $p(n_{bf})$ after the hard decision decoding, the probability distribution for the number of error message blocks when the hard decision decoding fails. However, it is difficult to obtain the probability distribution for the numbers of error message blocks. Therefore, the distribution for the number of error message blocks in the row BCH constituent code after the soft decision decoding may be replaced through the distribution for the number of column BCH constituent codes that fail in the hard decision decoding.

When a raw bit error rate (BER) of the NAND flash memory device is defined as $p_e$, probability $p(d_{cf})$ of decoding failure of the column BCH constituent code and probability $p(n_{bf})$ that is approximated to the probability of the number of decoding-failed column BCH constituent codes being $n_{bf}$ may be represented as Equation 20.

$$p(d_{cf}) = \Sigma_{i=t_c+1}^{n_c} \binom{n_c}{i} p_e^i (1-p_e)^{n_c-i}$$

$$p(n_{bf}) \approx \binom{\frac{k}{S_b}}{n_{bf}} p(d_{cf})^{n_{bf}} (1-p(d_{cf}))^{\frac{k}{S_b}-n_{bf}}$$

[Equation 20]

$t_c$ may represent the error correction capability of the column BCH constituent code or the BCH constituent code for next decoding.

Figure 6:
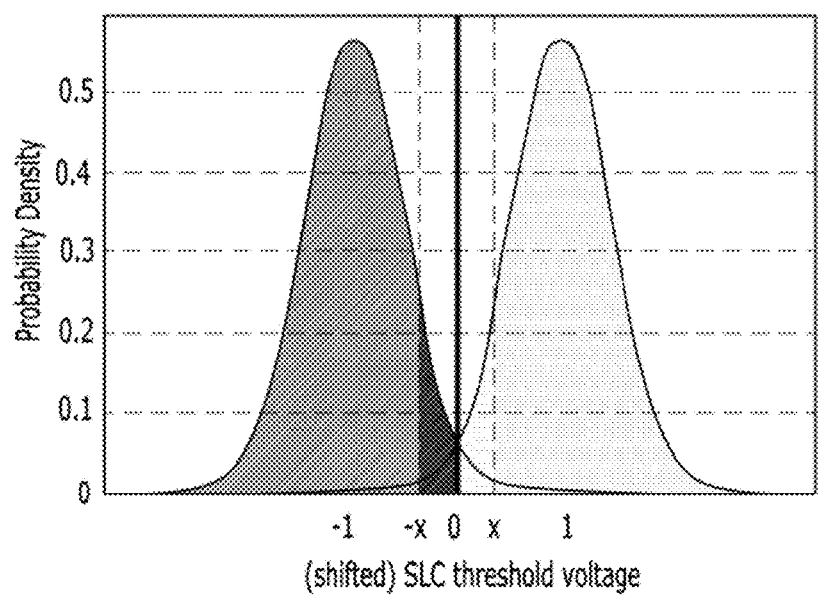
FIG. 6 is a graph illustrating a binary input addictive white Gaussian noise (BI-AWGN) channel in accordance with an embodiment of the present invention.

As described above, the probability such as $p(n_{fe}, dF|n_u, n_e, n_{ue}, n_{bf})$, $p(n_u, n_e|n_{ue}, n_{bf})$, $p(n_{ue}|n_{bf})$, $p(n_{bf})$ for obtaining $E[n_{fe}|dF]$ may be obtained through utilization of the probabilities $p_u$, $p_{ue}$, $p_r$, $p_{re}$, $p_e$ for the binominal distribution, which may be represented as the function of the quantization range x as shown in FIG. 6. When the Binary Additive White Gaussian Noise (BI-AWGN) is assumed and the variance of the noise is represented as $\sigma^2$, the probabilities may be represented as Equation 21.

$$p_u = Q\left(\frac{1-x}{\sigma}\right) - Q\left(\frac{1+x}{\sigma}\right)$$

$$p_{ue} = \frac{Q\left(\frac{1}{\sigma}\right) - Q\left(\frac{1+x}{\sigma}\right)}{p_u}$$

$$p_r = 1 - p_u$$

$$p_{re} = Q\left(\frac{1+x}{\sigma}\right)/p_r$$

$$p_e = Q\left(\frac{1}{\sigma}\right)$$

[Equation 21]

Therefore, the optimal reference voltage may be determined by changing the reference voltage that is the quantization range, detecting the error bits when the hard decision decoding fails, and determining the reference voltage for maximizing the average number of error bits.

Referring back to FIG. 5, at step S511, the controller may obtain soft decision information according to the optimal reference voltage obtained at step S509. The soft decision information may be obtained by performing the chase decoding.

At step S513, the memory controller may perform the soft decision decoding according to the soft decision information obtained at step S511. At step S515, the controller may determine whether the soft decision decoding is successful.

When the soft decision decoding is determined to fail as a result of the step S515, the read operation to the memory cell of the memory block may be finally determined to fail at step S517. That is, the controller may transfer a decoding fail signal to the host when the soft decision decoding fails.

When the soft decision decoding is determined to be successful as the result of the step S515, the controller may transfer the soft-decision decoded data to the host.

Figure 7A:
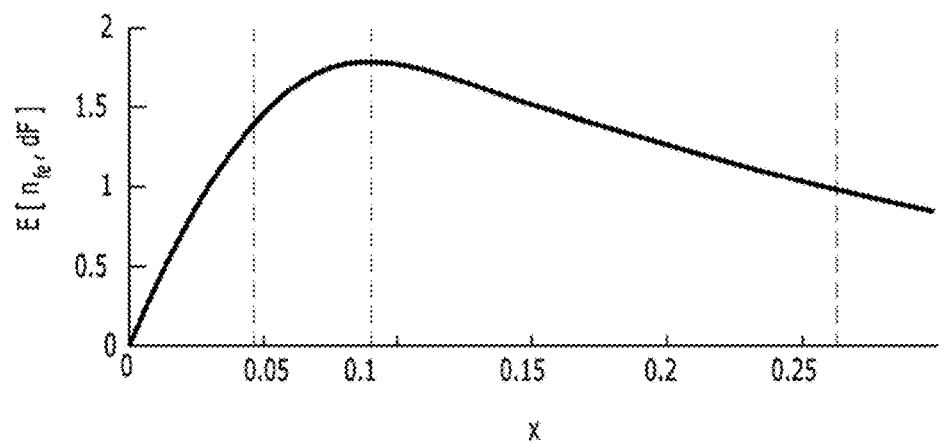
FIGS. 7A, 7B and 8 are graphs analysing values according to a change of quantization range and a result of error rates obtained through simulation in accordance with an embodiment of the present invention.
Figure 7B:
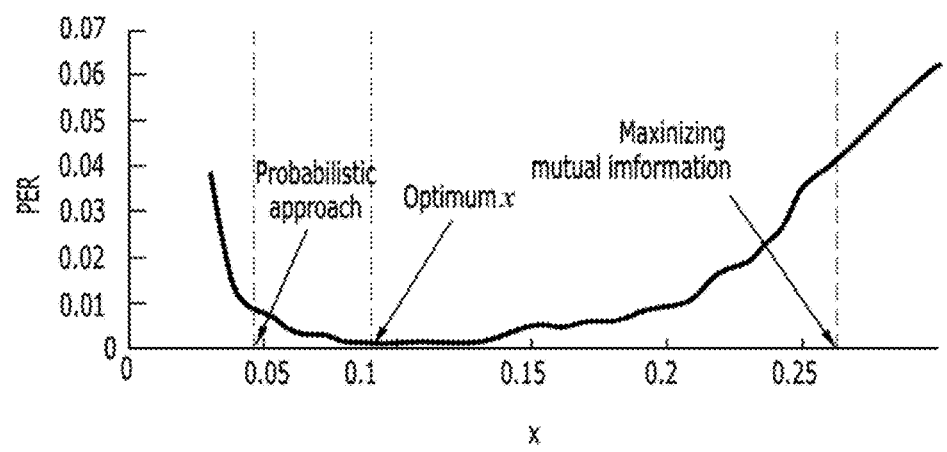
Figure 8:
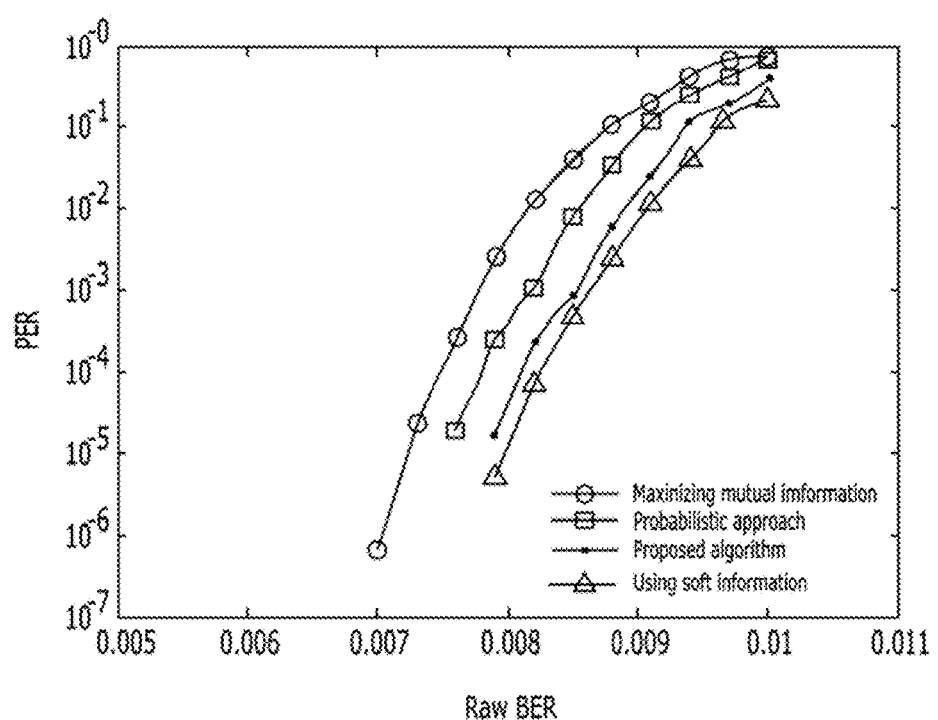

FIGS. 7A, 7B and 8 are graphs illustrating analysing values according to a change of quantization range and a result of error rate obtained through simulation iii accordance with an embodiment of the present invention.

FIGS. 7A, 7B and 8 show a result of performance simulation of the BC-BCH code (36568, 32768) including 38 numbers of the row BCH constituent code and 38 numbers of the column BCH constituent code.

Referring to FIGS. 7A and 7B, the simulation is taken under the assumption of a raw BER of 0.0085 and a Binary Additive White Gaussian Noise (BI-AWGN) channel. FIG. 7A shows the quantization range of 0.1 where $E[n_{fe}|dF]$ is maximized or the average number of the error bits is maximized. FIG. 7B also shows the quantization range of 0.1 around which the error rate is minimized.

FIG. 8 shows a comparison result between the quantization methods of the conventional technology and an embodiment of the present invention.

FIG. 8 shows comparison result of decoding performance of the soft decision decoding with the BC-BCH code between different read operations to the flash memory device. Referring to FIG. 8, it may be seen that the decoding performance of the BC-BCH code depends on the method of determination of the reference voltage. The conventional quantization methods compared with the embodiment of the present invention are (1) maximizing mutual information and (2) quantization methods where the product of the probability of the low reliability range and the BCH constituent code is the number of flipped bits (probabilistic approach).

Referring to FIG. 8, the quantization method that has most similar decoding capability to the soft decision decoding (using soft information) is the quantization method proposed according to the embodiment of the present invention (proposed algorithm). It may be seen that the similar decoding capability to the soft decision decoding is achieved even though 3 times of data read according to the determined reference voltages.

While the present invention has been described with respect to the specific embodiments, it will be apparent to those skilled in the art that various changes and modifications may be made without departing from the spirit and scope of the invention as defined in the following claims.

What is claimed is:

1. An operation method of a flash memory system, comprising:
    reading data stored in a memory device, wherein the data is encoded by units of message blocks each including a row constituent code and a column constituent code by using a block-wise concatenated Bose-Chadhuri-Hocquenghem (BC-BCH) method;
    performing a hard decision decoding on the read data;
    determining, when the hard decision decoding fails, a reference voltage for a message block having an error among the message blocks of the read data; and
    performing a soft decision decoding by using the determined reference voltage,
    wherein the reference voltage is determined to maximize average numbers of error bits included in bits that are randomly selected among bits having low reliability in the message block having the error, during the soft decision decoding.

2. The operation method of claim 1, wherein the soft decision decoding includes a turbo BC-BCH code decoding.

3. The operation method of claim 2, wherein the turbo BC-BCH code decoding is performed based on a chase decoding.

4. The operation method of claim 1, wherein the reference voltage is determined according to Equation 1.

$$\hat{x} = \arg\max_x E[n_{fe}|dF],$$

[Equation 1]

Wherein $\hat{x}$ represents the reference voltage, $n_{fe}$ represents a number of error bits of the message block having an error with a value in the range $0 < n_{fe} < p$, dF represents the message block having an error due to the failed hard decision decoding, $E[n_{fe}|dF]$ represents the average number of error bits included in the bits that are randomly selected among the bits having low reliability in the message block having an error when the hard decision decoding fails, and p represents the bits that are randomly selected among the bits having low reliability in the message block having an error.

5. The operation method of claim 4, wherein the average number of error bits ($E[n_{fe}|dF]$) is determined according to Equation 2.

$$E[n_{fe} \mid dF] = \sum_{n_{fe}} n_{fe} p(n_{fe} \mid dF)$$

$$= \sum_{n_{fe}} n_{fe} \sum_{n_u} \sum_{n_e} \sum_{n_{ue}} \sum_{n_{bf}} p(n_u, n_e, n_{ue}, n_{fe}, n_{bf} \mid dF)$$

$$= \sum_{n_{fe}} \frac{n_{fe}}{p(dF)} \sum_{n_u} \sum_{n_e} \sum_{n_{ue}} \sum_{n_{bf}} p(n_u, n_e, n_{ue}, n_{fe}, n_{bf}, dF)$$

[Equation 2]

$$p(n_u, n_e, n_{ue}, n_{fe}, n_{bf}, dF) = p(n_{fe}, dF \mid n_u, n_e, n_{ue}, n_{bf}) p(n_{ue}, n_e \mid n_u, n_{bf}) p(n_u \mid n_{bf}) p(n_{bf})$$

$$p(n_{ue}, n_e \mid n_u, n_{bf}) = p(n_{ue}, n_e \mid n_u, n_{bf} S_b + n - k - n_u)$$

$$= p(n_{ue}, n_{re} \mid n_u, n_{bf} S_b + n - k - n_u)$$

$$p(n_{ue}, n_{re} \mid n_u, n_{bf} S_b + n - k - n_u) = p(n_{ue}, n_{re} \mid n_u, n_{tr})$$

$$= p(n_{ue} \mid n_u, n_{tr}) p(n_{ue} \mid n_u, n_{tr})$$

$$= p(n_{ue} \mid n_u) p(n_{re} \mid n_{tr})$$

$$p(n_{fe}, dF \mid n_u, n_e, n_{ue}, n_{bf}) = \frac{\binom{n_{ue}}{n_{fe}} \binom{n_{ue} - n_u}{p - n_{fe}}}{\binom{n_u}{p}}$$

Wherein $n_u$ represents the number of bits having low reliability in the message block, $n_e$ represents a number of error bits of the message block, $n_{ue}$ represents a number of real error bits included in quantized bits of low reliability range in the message block, $n_{bf}$ represents a number of message blocks having an error among the message blocks, $p(n_{bf})$ represents a probability distribution for the message blocks that failed in the hard decision decoding among the message blocks, $p(n_u \mid n_{bf})$ represents a probability of bits having low reliability in the message block having the error, $S_b$ represents a number of bits of a single message block, n represents length of the message block to be decoded, k represents a number of bits of the message blocks, $n_{bf} S_b + n_c - k_c$, $n_u$ represents a number of bits having high reliability included in the message block having an error, $n_{re}$ represents a number of real error bits included in the quantized bits of the high reliability range in message block, $n_{tr}$ represents a number of the bits having the high reliability included in the message block, $p(n_{re} \mid n_{tr})$ represents probability of error bits in the high reliability range, and $p(n_{ue} \mid n_u)$ represents a probability of error bits in the low reliability range.

6. The operation method of claim 1, wherein the soft decision decoding is performed by obtaining soft decision information using the determined reference voltage.

7. The operation method of claim 1, further comprising transferring a decoding fail signal to a host when the soft decision decoding fails.

8. The operation method of claim 1, further comprising transferring the read data to a host when the soft decision decoding is successful.

* * * * *